United States Patent
Suzuki et al.

(10) Patent No.: US 11,749,546 B2
(45) Date of Patent: Sep. 5, 2023

(54) SURFACE INSPECTION APPARATUS, PROCESSING SYSTEM, AND METHOD OF MANUFACTURING ARTICLE

(71) Applicant: CANON KABUSHIKI KAISHA, Tokyo (JP)

(72) Inventors: Kohei Suzuki, Utsunomiya (JP); Shinichiro Hirai, Saitama (JP); Kenichi Kobayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 449 days.

(21) Appl. No.: 17/016,975

(22) Filed: Sep. 10, 2020

(65) Prior Publication Data

US 2021/0082726 A1    Mar. 18, 2021

(30) Foreign Application Priority Data

Sep. 13, 2019    (JP) ................................ 2019-167488

(51) Int. Cl.
*H01L 21/67*    (2006.01)
*G01N 21/01*    (2006.01)
(Continued)

(52) U.S. Cl.
CPC ....... *H01L 21/67288* (2013.01); *G01N 21/01* (2013.01); *G01N 21/47* (2013.01);
(Continued)

(58) Field of Classification Search
CPC ........... H01L 21/67288; H01L 21/0271; H01L 22/12; H01L 22/30; G01N 21/01;
(Continued)

(56) References Cited

U.S. PATENT DOCUMENTS

| | | | |
|---|---|---|---|
| 5,912,732 A * | 6/1999 | Sekine | G01N 21/94 |
| | | | 356/237.4 |
| 2015/0330914 A1* | 11/2015 | Maleev | G01N 21/47 |
| | | | 356/237.5 |
| 2019/0293570 A1* | 9/2019 | Kobayashi | G01N 21/9501 |

FOREIGN PATENT DOCUMENTS

| | | |
|---|---|---|
| JP | H1019792 A | 1/1998 |
| JP | 2019-028035 A | 2/2019 |

OTHER PUBLICATIONS

Notice of Reasons for Refusal issued by the Japan Patent Office dated Mar. 24, 2023 in corresponding JP Patent Application No. 2019-167488, with English translation.

* cited by examiner

*Primary Examiner* — John P. Dulka
(74) *Attorney, Agent, or Firm* — Carter, DeLuca & Farrell LLP

(57) ABSTRACT

Surface inspection apparatus includes stage for holding substrate, light source, scanning optical system for scanning light from the light source along first direction for plural times, stage scanning mechanism for scanning the stage in second direction intersecting with the first direction, and detector for detect scattered light from the substrate Inspection target region of the substrate is scanned by the light from the light source by an operation of the scanning optical system and the stage scanning mechanism. Chromatic aberration of the scanning optical system is corrected to fall within predetermined wavelength range. Fluctuation range of wavelength of the light from the light source is determined based on variation in total lighting time of the light source in scanning period of each light scanning operation along the first direction. The fluctuation range falls within the predetermined wavelength range.

18 Claims, 14 Drawing Sheets

(51) Int. Cl.
    *G01N 21/47*      (2006.01)
    *G01N 21/95*      (2006.01)
    *H01L 21/027*     (2006.01)
    *G03F 7/00*       (2006.01)
    *H01L 21/66*      (2006.01)
(52) U.S. Cl.
    CPC ....... *G01N 21/9505* (2013.01); *G03F 7/0002* (2013.01); *H01L 21/0271* (2013.01); *H01L 22/12* (2013.01); *G01N 2201/021* (2013.01); *G01N 2201/06113* (2013.01)
(58) Field of Classification Search
    CPC ............... G01N 21/47; G01N 21/9505; G01N 2201/021; G01N 2201/06113; G01N 21/94; G01N 21/9501; G01N 21/8806; G01N 21/956; G01N 21/88; G03F 7/0002
    See application file for complete search history.

FIG. 2
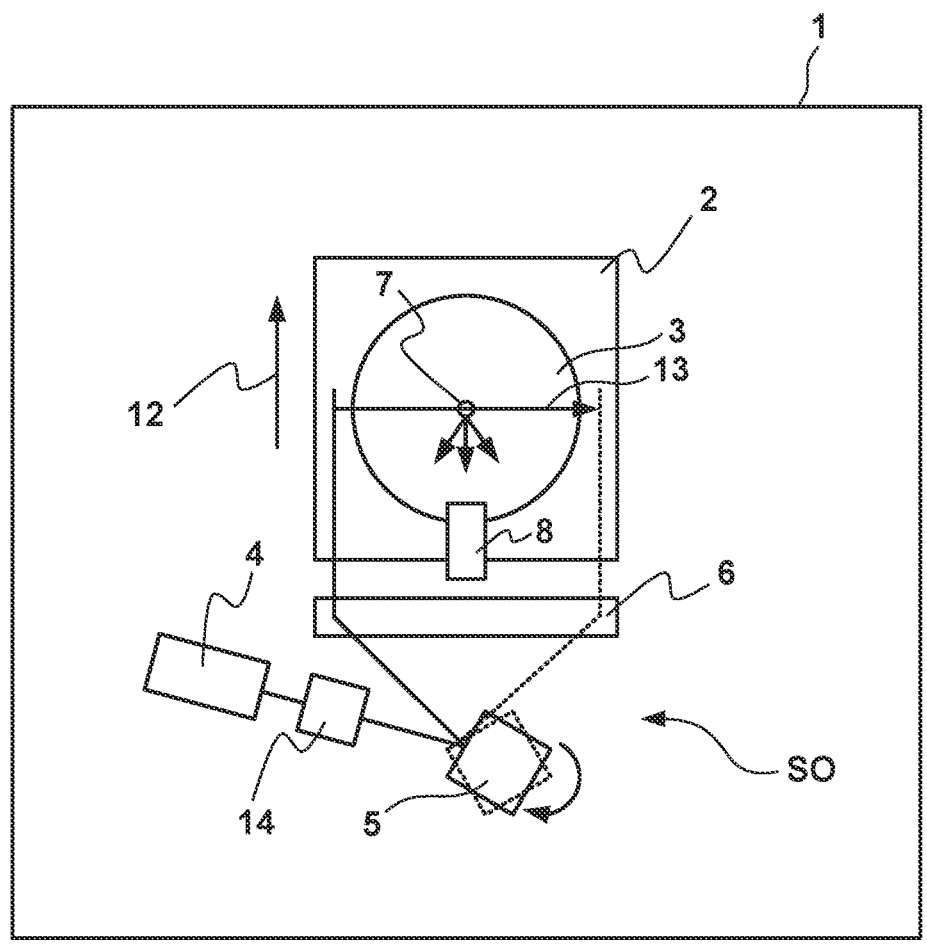
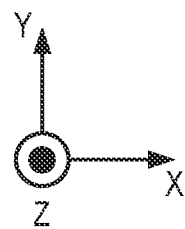

SURFACE INSPECTION APPARATUS, PROCESSING SYSTEM, AND METHOD OF MANUFACTURING ARTICLE

BACKGROUND OF THE INVENTION

Field of the Invention

The present invention relates to a surface inspection apparatus, a processing system, and a method of manufacturing an article.

Description of the Related Art

As equipment for manufacturing an article by processing a substrate, a surface inspection apparatus that inspects the surface of the substrate can be used. A surface inspection apparatus will, for example, detect a foreign substance by irradiating and scanning the surface of a substrate with an oblique incident light beam and causing a detector to receive the scattered light from the foreign substance. A very highly sensitive detector, for example, a photomultiplier tube or the like can be used to detect a foreign substance of, for example, about several tens of nanometers. In a photomultiplier tube, after electrons generated in a photocathode by the light incidence are accelerated by a high voltage, the electrons are made to collide with the first stage of a plurality of stages of dynodes which are configured to generate secondary electrons. A current that has been accumulated until it has passed the dynode of the last stage is collected in an anode as an amplified signal. In this manner, although the photomultiplier tube can detect light which has a very low intensity, the output from the photomultiplier tube will be saturated for a long period if intense scattered light from the edge of the substrate enters the photomultiplier tube, and it will be impossible to perform measurement during this period. Furthermore, if an anode current which is equal to or more than the rating flows, there is a possibility that the photomultiplier tube will receive irreparable damage.

Japanese Patent Laid-Open No. 10-19792 discloses a wafer surface inspection apparatus that reliably inspects the entire surface of a wafer by removing a region that cannot be inspected due to scattered light from the edge of the wafer. The wafer surface inspection apparatus inspects the surface of the wafer based on the signal of a light receiving unit that falls within a range excluding a transition area where scanning is performed from the outside of a target object to the target object. Japanese Patent Laid-Open No. 10-19792 also discloses that although the lighting of a light source unit will be turned on within a data detection range, the lighting of the light source unit will not be turned on in the transition area.

When control is performed to turn on and off the lighting of a light source while scanning a substrate with the light from the light source, the total lighting time of the light source in each scanning period can vary among the plurality of scanning periods. This can cause the wavelength range of light which is generated from the light source to change in each scanning period. In general, in a surface inspection apparatus, the spot diameter of a light beam that scans the surface of the substrate needs to be reduced so that the scattered light from a pattern of the substrate can be discriminated from the scattered light from a foreign substance. To implement this, chromatic aberration of an optical system can be corrected in only a wavelength range according to the design specifications. If the wavelength range of light from the light source changes in each scanning period and the wavelength range falls outside of the wavelength range of the design specifications, the chromatic aberration of the optical system will appear conspicuously. This may degrade the measurement accuracy or make measurement impossible. Although it may be possible to design an optical system so that the chromatic aberration will be suppressed in the optical system, this may not be practical in some cases when factors such as the difficulty of design, the allowed value of tolerance, the manufacturing cost, and the like are considered.

SUMMARY OF THE INVENTION

The present invention provides a technique advantageous in suppressing a detection failure that occurs due to aberration in an optical system by suppressing high-intensity scattered light from being generated on a substrate.

A first aspect of the present invention provides a surface inspection apparatus that includes a stage configured to hold a substrate, a light source, a scanning optical system configured to scan light from the light source along a first direction for a plurality of times, a stage scanning mechanism configured to scan the stage in a second direction which intersects with the first direction, and a detector configured to detect scattered light from a surface of the substrate, and inspects the surface of the substrate based on a signal from the detector, wherein an inspection target region of the substrate is scanned by the light from the light source by an operation of the scanning optical system and the stage scanning mechanism, chromatic aberration of the scanning optical system is corrected to fall within a predetermined wavelength range a fluctuation range of a wavelength of the light generated by the light source is determined based on variation in a total lighting time of the light source in a scanning period of each light scanning operation performed a plurality of times along the first direction by the scanning optical system, and the fluctuation range falls within the predetermined wavelength range.

Further features of the present invention will become apparent from the following description of exemplary embodiments with reference to the attached drawings.

BRIEF DESCRIPTION OF THE DRAWINGS

FIG. 2 is a plan view schematically showing the arrangement of the surface inspection apparatus 1 of the embodiment;

DESCRIPTION OF THE EMBODIMENTS

Figure 1:
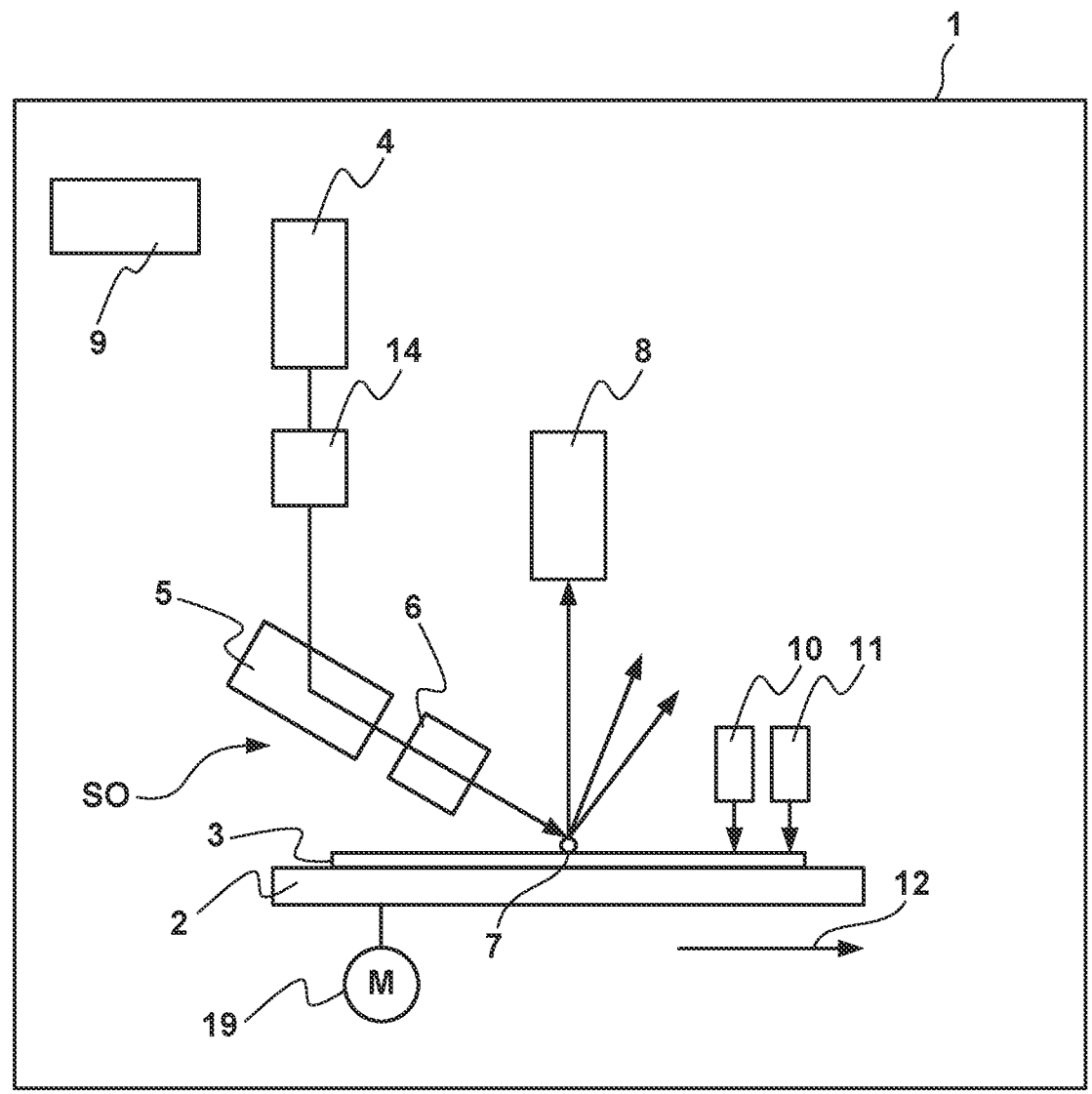
FIG. 1 is a side view schematically showing the arrangement of a surface inspection apparatus 1 according to an embodiment.

Embodiments will be described in detail hereinafter with reference to the accompanying drawings. Note that the following embodiments do not limit the invention of the appended claims. Although a plurality of characteristic features are described in the embodiments, not all of the characteristic features are essential to the present invention, and the plurality of characteristic features may be arbitrarily combined. Furthermore, same reference numerals are used to denote same arrangements or arrangements similar to each other in the accompanying drawings, and a repetitive description thereof will be omitted.

<Basic Arrangement of Surface Inspection Apparatus>

The basic arrangement of a surface inspection apparatus 1 according to an embodiment will be described with reference to FIGS. 1 and 2. FIGS. 1 and 2 are a side view and a plan view, respectively, each schematically showing the arrangement of the surface inspection apparatus 1 according to the embodiment. The surface inspection apparatus 1 is formed as an apparatus that inspects the surface of a substrate 3. The surface inspection apparatus 1 can be used as, for example, a foreign substance inspection apparatus that inspects whether a foreign substance is present on the surface of the substrate 3. The surface inspection apparatus 1 can include, for example, a stage 2, a light source 4, a scanning optical system SO, a stage scanning mechanism 19, a detector 8, and a controller 9. The stage 2 includes a chuck for holding the substrate 3. The light source 4 generates light that is to be emitted onto the surface of the substrate 3. The scanning optical system SO scans (main scanning operation), for a plurality of times, the light from the light source 4 along an X direction (first direction). In this case, the X direction matches a main scanning direction 13. The stage scanning mechanism 19 can be formed to scan (sub-scanning operation) the substrate 3 (the stage 2) in a Y direction (second direction) perpendicular to or intersecting with the X direction. In this case, the Y direction matches a sub-scanning direction 12. The stage scanning mechanism 19 may be formed to be capable of driving the substrate 3 (the stage 2) in also the X direction in addition to the Y direction. The detector 8 detects scattered light from a foreign substance 7 on the surface of the substrate 3.

The light source 4 can be a laser light source such as a semiconductor laser light source or the like. In a case in which the surface inspection apparatus 1 is to be used as an apparatus for inspecting the surface of a substrate to be provided to an imprint apparatus or an exposure apparatus, the wavelength of the light to be generated by the light source 4 can be set to a wavelength that will not photosensitize a resist material to be arranged on the substrate 3. Light used by an imprint apparatus to cure a resist material (curable composition) can be UV light. Hence, in a case in which the surface inspection apparatus 1 is to be used together with an imprint apparatus, it is preferable to set the wavelength of the light generated by the light source 4 to be equal to or more than 400 nm. The light source 4 can be arranged so that the intensity of light to be generated can be changed in accordance with a process condition (for example, the reflectance with respect to the wavelength of the light generated by the light source 4) by which the substrate 3 will be processed. In a case which a semiconductor laser apparatus is applied as the light source 4, control to turn on and off (ON and OFF) the lighting can be performed at, for example, a frequency equal to or more than 100 MHz.

The scanning optical system SO can include, for example, a focus optical system 14, a polygon mirror 5 and an fθ lens 6. The focus optical system 14 can be used to adjust the spot diameter of the light emitted on the substrate 3 via the scanning optical system SO. The focus optical system 14 can adjust the spot diameter of the light emitted on the substrate 3 by, for example, adjusting a position in an optical-axis direction. After the light has passed through the focus optical system 14, the light from the light source 4 can be emitted onto a mirror surface of the polygon mirror 5. The polygon mirror 5 can scan the light, which is to be emitted onto the substrate 3, on the substrate 3 for a plurality of times in the X direction by uniformly rotating a polyhedral mirror block (a tetrahedral mirror block in FIG. 2) at an arbitrary speed. The rotary driving operation of the polygon mirror 5 can be performed, for example, at a constant speed that falls within a range of 10,000 rpm to 30,000 rpm. The polygon mirror 5 can be rotatably supported by an air bearing that has superior durability. Note that light irradiation on the substrate 3 will be stopped if the light source 4 is turned off while light scanning by the scanning optical system SO is being performed in the scanning period. However, for the sake of descriptive convenience, it will be described that the substrate 3 and a region (the stage 2) outside the substrate are being scanned by light during a scanning period in this specification.

Light reflected by the polygon mirror 5 can be emitted on the substrate 3 via the fθ lens 6. The fθ lens 6 converts the uniform rotary motion of the polygon mirror 5 into a uniform linear motion of a spot that moves on the surface (focal plane) of the substrate 3. This uniform linear motion is the motion along the X direction, that is, the main scanning direction 13. A telecentric-type lens that can emit light perpendicular to the focal plane can be used as the fθ lens 6. The stage 2 is scanned, by the stage scanning mechanism 19, in the Y direction, that is, the sub-scanning direction 12 that is perpendicular to and intersects with the main scanning direction 13.

The detection-target foreign substance 7 that adheres to the surface of the substrate 3 can be a particle whose minimum grain size is equal to or more than several tens of nm. When the foreign substance 7 is irradiated with light, scattered light is generated from the foreign substance 7. The detector 8 for detecting the scattered light needs to be capable of detecting very small changes in the light intensity. The detector 8 can include, for example, a photomultiplier tube. The detector 8 is arranged at a position where a back reflection or a lateral reflection from the foreign substance 7 can be detected.

The substrate 3 has an unevenness such as a circuit pattern or the like, and scattered light is also generated from such an unevenness. Hence, the signal of the foreign substance 7 needs to be extracted from the output signal of the detector 8. In other words, a signal which has resulted from the scattered light from an unevenness included in a circuit pattern or the like needs to be discriminated from a signal which has resulted from the scattered light from the foreign substance 7. To increase the accuracy of the discrimination, the spot diameter of the light which is to scan the surface of the substrate 3 needs to be optimized based on the size of a foreign substance as a detection target and the size of a pattern such as a circuit pattern or the like. The size of a foreign substance as the detection target tends to be smaller than the size of a pattern such as a circuit pattern or the like. If the spot diameter of the light increases in this case, a phenomenon in which the intensity of the scattered light from a pattern, such as a circuit pattern, does not decrease while the intensity of the scattered light from the foreign substance 7 decreases can occur. This can cause S/N ratio degradation. The spot diameter of the light can be adjusted by driving the focus optical system 14 in the optical-axis direction as described above.

The controller 9 performs driving (positioning) control of the stage 2, control to turn on and off (ON and OFF) the light source 4, and rotary control of the polygon mirror 5. The controller 9 can also perform, for example, signal processing by converting the continuous analog signals output from the detector 8 into digital signals. The signal processing can be processing performed by obtaining the center of gravity of a light intensity signal on a Gaussian distribution obtained from the scattered light from a foreign substance, and calculating the coordinate position of the foreign substance corresponding to the center coordinate position (0, 0) of the substrate 3 from the number of main scanning operations corresponding to the position of the stage 2 and the number of data sampling operations from the scan start position of the light. The grain size can also be predicted based on the peak value and the width of an obtained intensity distribution.

The surface inspection apparatus 1 can include a mark measurement device 10. The mark measurement device 10 can be an alignment scope generally used in an exposure apparatus. An alignment scope generally used in an exposure apparatus is used to overlay a new pattern on a pattern provided on the substrate 3, and can measure the position of each alignment mark provided on the substrate 3. The surface inspection apparatus 1 can include a displacement gauge 11. The displacement gauge 11 can be a non-contact sensor for measuring the height of the substrate 3. For example, a reflective laser displacement gauge that can measure a mirror surface can be used as the displacement gauge 11.

<Operation of Comparative Example>

Figure 3:
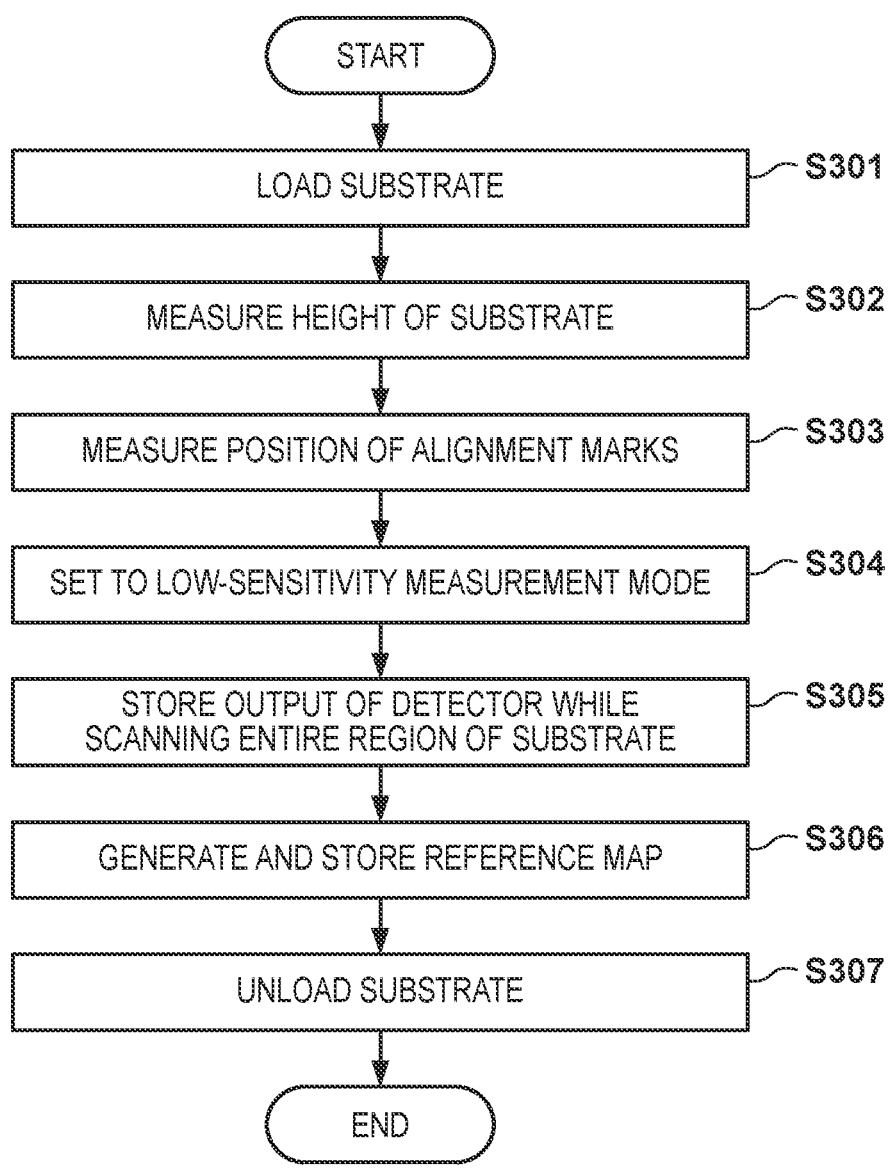
FIG. 3 is a flowchart of processing for obtaining a reference map.

A comparative example will be described with reference to FIGS. 3 and 4. FIG. 3 is a flowchart of processing for obtaining a reference map. This processing is controlled by the controller 9. A reference map is obtained by converting the illumination distribution on the entire substrate 3 into a map. The reference map is obtained to generate a lighting control map (lighting control information) that shows each position where the light source 4 is to be turned on (the timing at which the light source 4 is to be turned on) on the substrate 3 during the inspection of the surface of the substrate 3.

First, in step S301, the substrate 3 is loaded onto the stage 2. Next, in step S302, the displacement gauge 11 is used to measure the height of the substrate 3, and the measurement result is stored as the information of the substrate 3 to be used during reference map obtainment. Next, in step S303, the position of each of a plurality of alignment marks provided on the substrate 3 is measured, a position (X, Y, Z) of the substrate 3 is obtained based on the measurement result, and the result of this obtainment is stored as the position information of the substrate 3 to be used during reference map obtainment.

Next, in step S304, the operation mode of the surface inspection apparatus 1 is set to a low-sensitivity measurement mode in which the intensity of the light generated by the light source 4 is reduced to a level that will not cause the output from the detector 8 to saturate in the entire region (including the edge) of the substrate 3. The low-sensitivity measurement mode may also be implemented by reducing the sensitivity of the detector 8 or by inserting an ND filter in an optical path from the light source 4 to the substrate 3 or in an optical path from the substrate 3 to the detector 8.

Next, in step S305, the light from the substrate 3 is detected by the detector 8 while the entire region (including the edge) of the substrate 3 is scanned (the main scanning operation and the sub-scanning operation) by the light from the light source 4 in a state in which the light source 4 is constantly turned on, and the output obtained from the detection is stored. Next, in step S306, a reference map that shows the intensity of light from each coordinate position (X, Y) on the substrate 3 is generated from the result obtained in step S305, and the generated reference map is stored. The minimum pitch of each coordinate position (X, Y) of the substrate 3 can be determined based on the scanning speed of the light, the scanning speed of the stage 2, and the frequency used in the frequency modulation of the light source 4. In a case in which the main scanning speed of the light is set to 700 m/sec and the frequency of the frequency modulation of the light source 4 is set to 100 MHz (0.01 μsec), the minimum pitch in the x direction (main scanning direction) will be 7 μm. Also, in a case in which the sub-scanning speed of the stage 2 is set to 20 mm/sec and the scanning frequency of the light is set to 1,500 Hz, the minimum pitch in the Y direction (sub-scanning direction) will be 13.3 μm.

Figure 4:
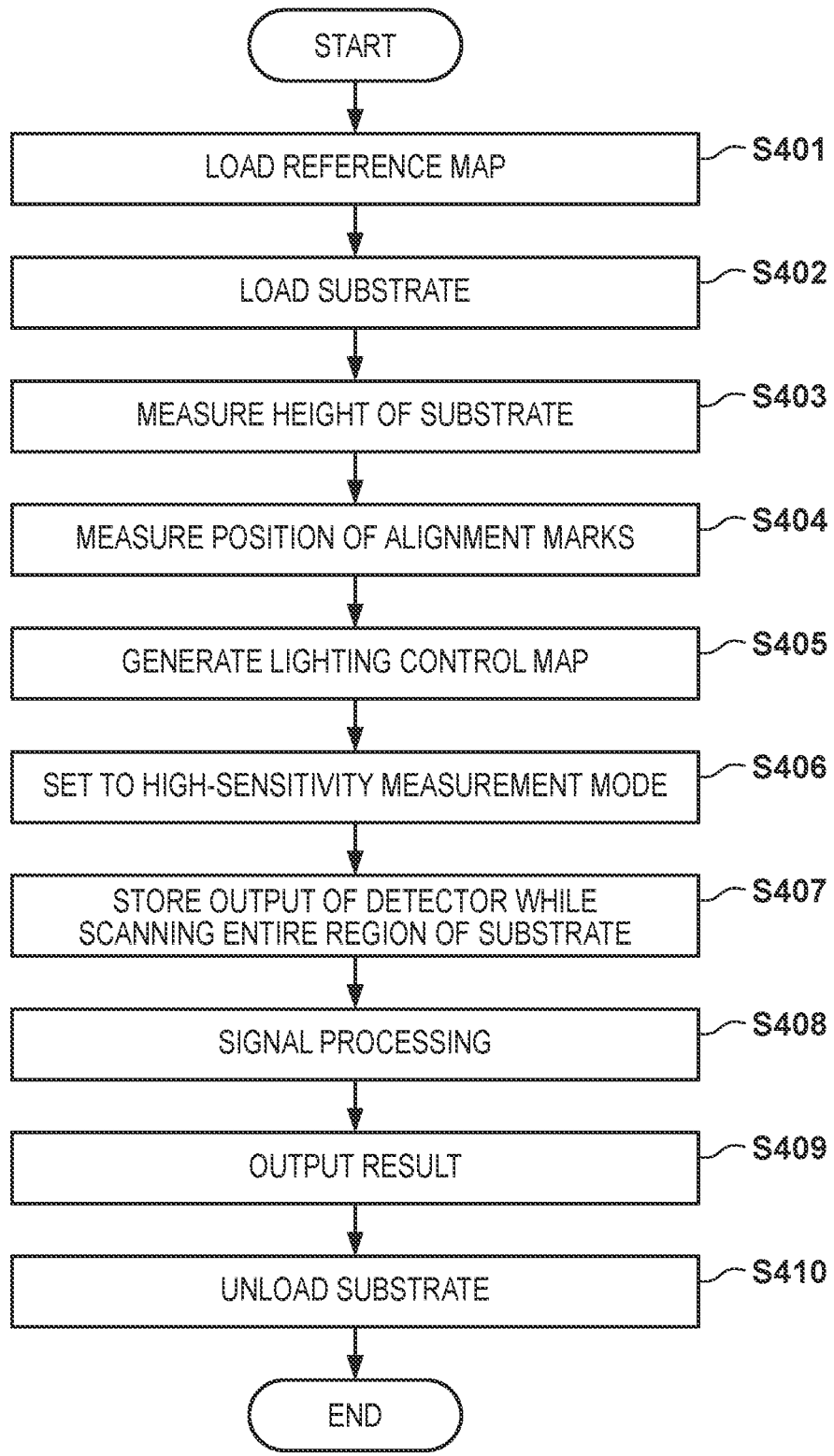
FIG. 4 is a flowchart of processing for inspecting the surface of a substrate.

FIG. 4 is a flowchart of processing for inspecting the surface of the substrate 3. This processing is controlled by the controller 9. First, in step S401, the reference map that was generated by the processing shown in FIG. 3 is loaded. Next, in step S402, the substrate 3 is loaded onto the stage 2. Next, in step S403, the displacement gauge 11 is used to measure the height of the substrate 3. Next, in step S404, the position of each of the plurality of alignment marks provided on the substrate is measured, and the position (X, Y, Z) of the substrate 3 is obtained based on the measurement result.

Next, in step S405, the intensity of light from each coordinate position on the reference map is converted into the intensity of light output from the detector 8 when a high-sensitivity measurement mode is set, and a lighting control map is generated. In the generated lighting control map, each coordinate position with a converted light intensity which exceeds a permissible level is set so that lighting will be turned off (OFF) and each coordinate position with a converted light intensity which does not exceed the permissible level is set so that lighting will be turned on (ON). In this case, the permissible level is a level at which the detector 8 will not breakdown, the lifetime of the detector 8 will not be reduced, and the output of the detector 8 will not be saturated. The lighting control map has a pitch (resolution) set based on the combination of each coordinate position of the substrate 3 and information indicating whether the light source 4 is to be turned on or off at this coordinate position. A coordinate position at which the light source 4 will be turned off can be set by considering the relative positional error between the light irradiation position on the substrate 3 and the edge of the substrate 3.

A region where the light source 4 will be turned off on the substrate 3 (a region which will not be irradiated with light on the substrate 3) is a coordinate position where a foreign substance cannot be detected even if the foreign substance is present. Thus, it is preferable for the region of the substrate 3 where the light source 4 will be turned off to be as small as possible. Hence, the relative position between the light irradiation position of the substrate 3 and the edge of the substrate 3 needs to be controlled highly accurately. Therefore, a difference between the height of the substrate 3 measured in step S403 and the height obtained at the time of the generation of the reference map in step S302 is calculated, and a correction operation is performed based on this difference. For example, in a case in which the angle of incidence of the light is 80° and the height difference of the substrate 3 is 20 µm, the spot position of the light will shift to the scanning direction of the stage 2 by 20/tan(10°)=113.4 µm. The lighting control map or the scanning position of the stage 2 may be corrected based on this shift amount. Furthermore, the lighting control map can be corrected based on the position of the substrate 3 measured in step S404 and the position of the substrate 3 obtained at the time of the generation of the reference map in step S303.

Next, in step S406, the operation mode of the surface inspection apparatus 1 is set to the high-sensitivity measurement mode. The high-sensitivity measurement mode is a mode in which measurement (inspection of the surface of the substrate 3) is performed at a sensitivity at which a foreign substance can be detected. Next, in step S407, surface inspection processing for inspecting the surface of the substrate 3 is executed. More specifically, in step S407, while the lighting of the light source 4 is controlled in accordance with the lighting control map, the detector 8 detects the light from the substrate 3 while the main scanning operation by the scanning optical system SO and the sub-scanning operation by the stage scanning mechanism 19 are being performed, and the output from the detector is stored. Next, in step S408, signal processing is performed based on the signal stored in step S407, and the presence/absence of a foreign substance on the surface of the substrate 3 is determined. In step S409, the result of the process of step S408 is output. In step S410, the substrate 3 is unloaded from the stage 2.

<Problem of Comparative Example>

A problem of the above-described comparative example will be described hereinafter with reference to FIG. 5 and FIGS. 6A to 6C. In a case in which the surface inspection processing is to be executed in accordance with the lighting control map generated by the method described with reference to FIGS. 3 and 4, the total lighting time of the light source 4 in each scanning period can vary among the plurality of scanning periods. In this case, the total lighting time of the light source 4 in each scanning period is the sum of the lighting times of the light source 4 in each scanning period. In this specification, a value obtained by dividing the total lighting time of the light source 4 in a scanning period by the scanning period will be referred to as an "ON/OFF duty". The fact that the total lighting time of the light source 4 in each scanning period (main scanning period) varies among the plurality of scanning periods corresponds to the fact that the ON/OFF duty of each of the plurality of scanning periods (main scanning periods) varies.

Figure 5:
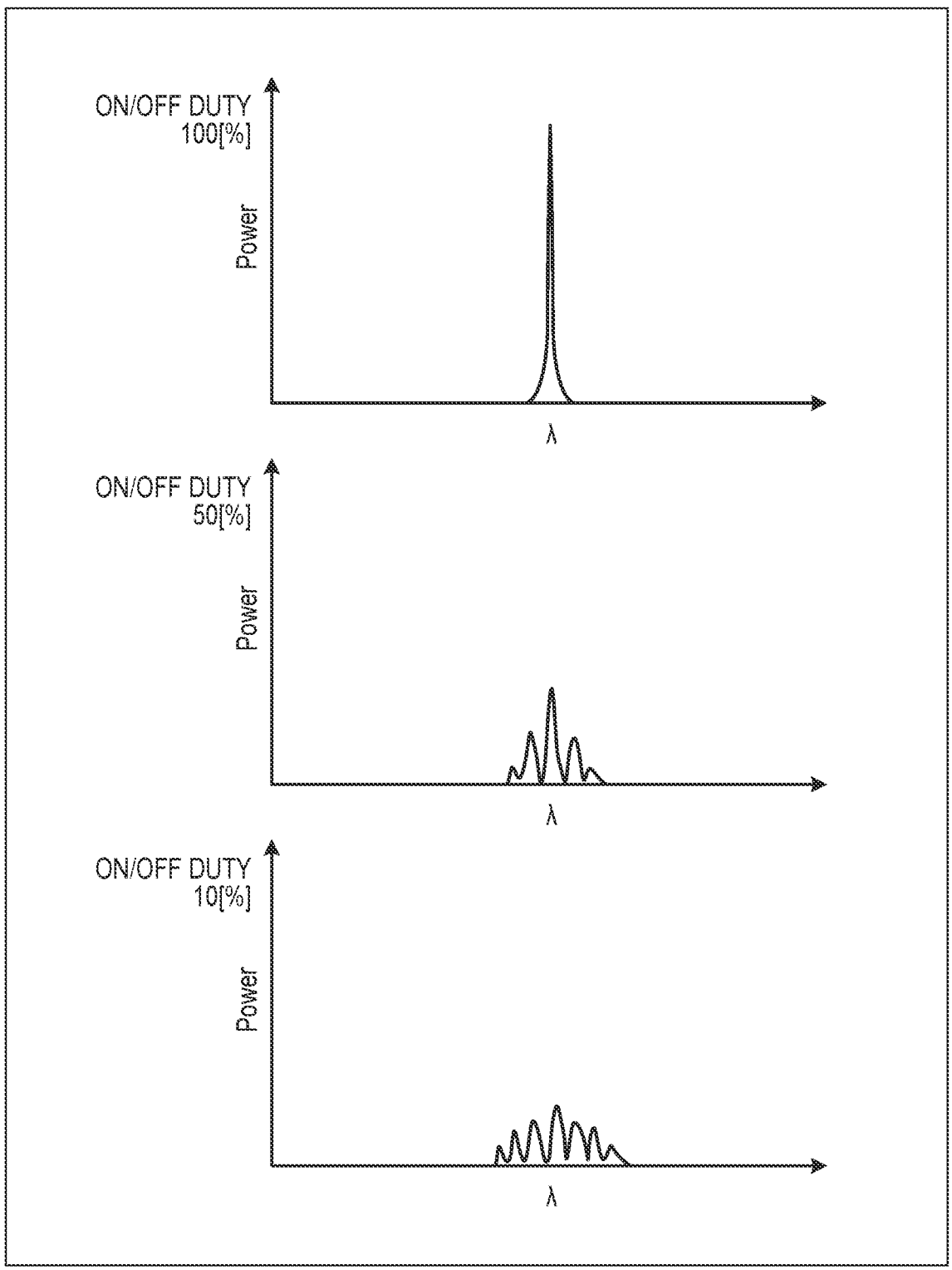
FIG. 5 is a view showing an example of changes in a wavelength spectrum of light generated by a light source.

FIG. 5 shows examples of the wavelength spectrum of the light generated by a laser light source as the light source 4 in cases in which the ON/OFF duty of the laser light source is set to 100%, 50%, and 10%. It can be seen that the light beams generated by the laser light source at 100%, 50%, and 10% have wavelength spectra that are different from each other. In this manner, the wavelength spectrum will become increasingly discrete as the ON/OFF duty is decreased. In this case, the longer the period in which the lighting is set to OFF during a scanning period, the wider the width of the wavelength spectrum. This kind of phenomenon is also recognized in other types of light sources.

In an apparatus for inspecting a foreign substance on a substrate, the spot diameter of the light that scans the surface of the substrate needs to be made small to increase the intensity of the scattered light from the foreign substance while suppressing the scattered light from the pattern provided on the substrate. Hence, it is useful to determine, as a design specification, the wavelength range (a predetermined wavelength range) of the light, and correct the chromatic aberration of the scanning optical system so that a desired spot diameter can be implemented within this wavelength range. However, if the ON/OFF duty varies in each scanning period (main scanning period), the width (the wavelength range) of the wavelength spectrum of the light generated by the light source 4 can increase as exemplified in FIG. 5 and depart from the wavelength range (the predetermined wavelength range) as the design specification. If the wavelength of the light generated by the light source 4 departs from the wavelength range as the design specification, the chromatic aberration of the scanning optical system SO will appear conspicuously. This can degrade the measurement accuracy or make measurement impossible. Although it may be possible to design an optical system so that the chromatic aberration will be suppressed in the optical system, this may not be practical in some cases when factors such as the difficulty of design, the allowed value of tolerance, the manufacturing cost, and the like are considered.

An example of a factor that causes the ON/OFF duty to change for each scanning operation is the measure taken against the scattered light from the edge of a substrate as described in the aforementioned comparative example. Since the scattered light from the edge of the substrate has a high intensity, it can cause the output from the detector for detecting the scattered light to become saturated and make measurement impossible for a corresponding period of time. Therefore, in the aforementioned comparative example, a lighting control map is generated so as not to irradiate the edge of the substrate with light.

Figure 6:
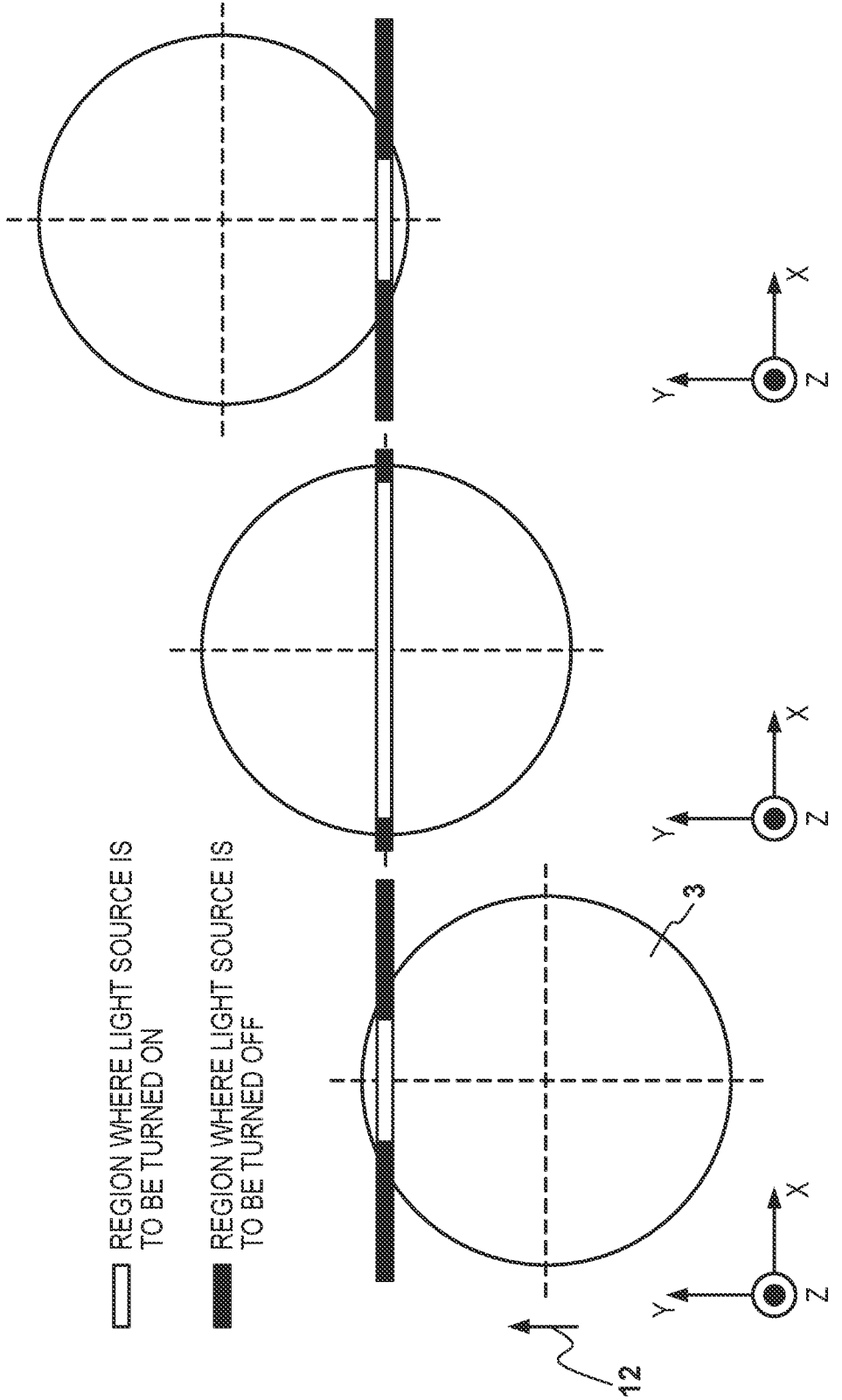
FIGS. 6A to 6C are views for explaining a comparative example.
Figure 7:
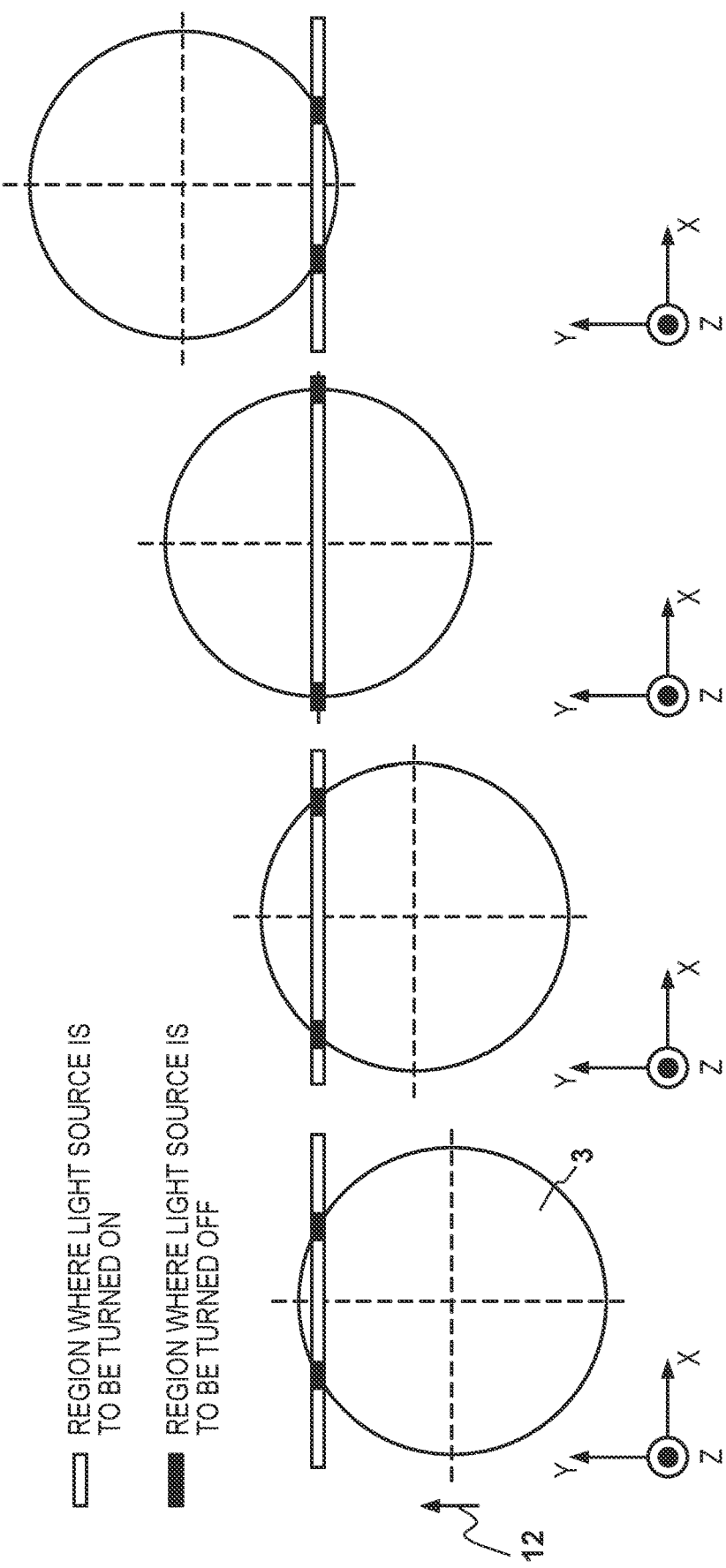
FIGS. 7A to 7D are views for explaining the first embodiment.

However, as exemplified in FIGS. 6A to 6C, the ON/OFF duty will change among the plurality of scanning periods. FIGS. 6A, 6B, and 6C show the states (ON and OFF) of the light source 4 near the start of the substrate inspection processing, near the middle of the substrate inspection processing, and near the end of the substrate inspection processing, respectively. Each black region indicates that a region which will not be irradiated with light because the light source 4 will be turned off in a state in which the polygon mirror 5 of the scanning optical system SO and the stage 2 are set in a state that allows light irradiation to the region. Each white region indicates a region which will be irradiated with light because the light source 4 will be turned on in a state in which the polygon mirror 5 of the scanning optical system SO and the stage 2 are set in a state that allows light irradiation to the region.

First Embodiment

The first embodiment of the present invention will be described with reference to FIGS. 7A to 7D and FIG. 8. Assume that matters not mentioned as the first embodiment follow those of the above-description. In the first embodiment, a lighting control map as schematically shown in FIGS. 7A to 7D is prepared, and processing to inspect the surface of a substrate 3 is executed by a controller 9 in accordance with this lighting control map. In a horizontally-oriented rectangle shown in each of FIGS. 7A to 7D, the control operations (ON and OFF) of a light source 4 in a scanning period are shown, and each region with light irradiation (corresponding to a period in which the light source turned on) and each region without light irradiation (corresponding to a period in which the light source is turned off) in the scanning period are also shown.

In the first embodiment, the ON/OFF duty variation among the plurality of scanning periods will be restricted schematically. More preferably, the ON/OFF duty variation among the plurality of scanning periods will be reduced to 0. However, a corresponding range of tolerance has been set for the ON/OFF duty variation between the plurality of scanning periods, and this range of tolerance can depend on the wavelength range in which the correction of the chromatic aberration of a scanning optical system is performed.

The chromatic aberration of the scanning optical system SO is corrected based on a wavelength range (a predetermined wavelength range) of light that has been set as a design specification, and a desired spot diameter (a spot diameter corresponding to the dimension of a foreign substance to be detected) of the light which is to irradiate the substrate 3 is ensured within this wavelength range. The fluctuation range of the wavelength of the light generated by the light source 4 is determined based on the variation in the total lighting time of the light source 4 during the scanning period of each light scanning operation which is performed along the X direction (first direction) for a plurality of times by the scanning optical system SO. In the first embodiment, the processing to inspect the surface of the substrate 3 is executed in accordance with a lighting control map that is determined so that this fluctuation range will fall within the wavelength range (the predetermined wavelength range) of light set as the design specification. As a result, the wavelength of the light generated by the light source 4 will be suppressed to fall within the wavelength range in which the chromatic aberration of the scanning optical system will be corrected.

In the first embodiment shown in FIGS. 7A to 7D, each lighting control map shows that the light source 4 is turned off in each region (black region) of a predetermined length (in the X direction) including the edge of the substrate 3 and that the light source 4 is turned on in each other region (white region). From another point of view, it can be expressed that, other than the inspection target region of the substrate 3, a region outside the substrate 3 will also be irradiated with light in the first embodiment. However, a corresponding margin can be arranged so the edge of the substrate 3 will not be irradiated with light. In the examples shown in FIGS. 7A to 7D, each region (period) where the light source 4 is to be turned off is determined by considering such a margin.

Each light scanning operation to be performed a plurality of times can be defined as including an operation to scan a first scanning line between the edge of the substrate 3 and the center of the substrate 3 in the second direction (Y direction) and an operation to scan a second scanning line between the first scanning line and the center of the substrate. The first scanning line corresponds to, for example, the scanning line shown in FIG. 7A, and the second scanning line corresponds to, for example, the scanning line shown in FIG. 7B. In this kind of a definition, the total time in which the region outside of the substrate 3 is irradiated with light during the operation to scan the first scanning line will be longer than the total time in which the region outside of the substrate 3 is irradiated with light during the operation to scan the second scanning line.

In the scanning period of each light scanning operation performed a plurality of times, the total lighting time of the light source 4 can be set to fall within a range equal to or less than ±20% of a predetermined reference time, is preferably set to fall within a range equal to or less than ±10% of the predetermined reference time, and is more preferably set to fall within a range equal to or less than ±6% of the predetermined reference time. This predetermined reference time can be set arbitrarily.

Figure 8:
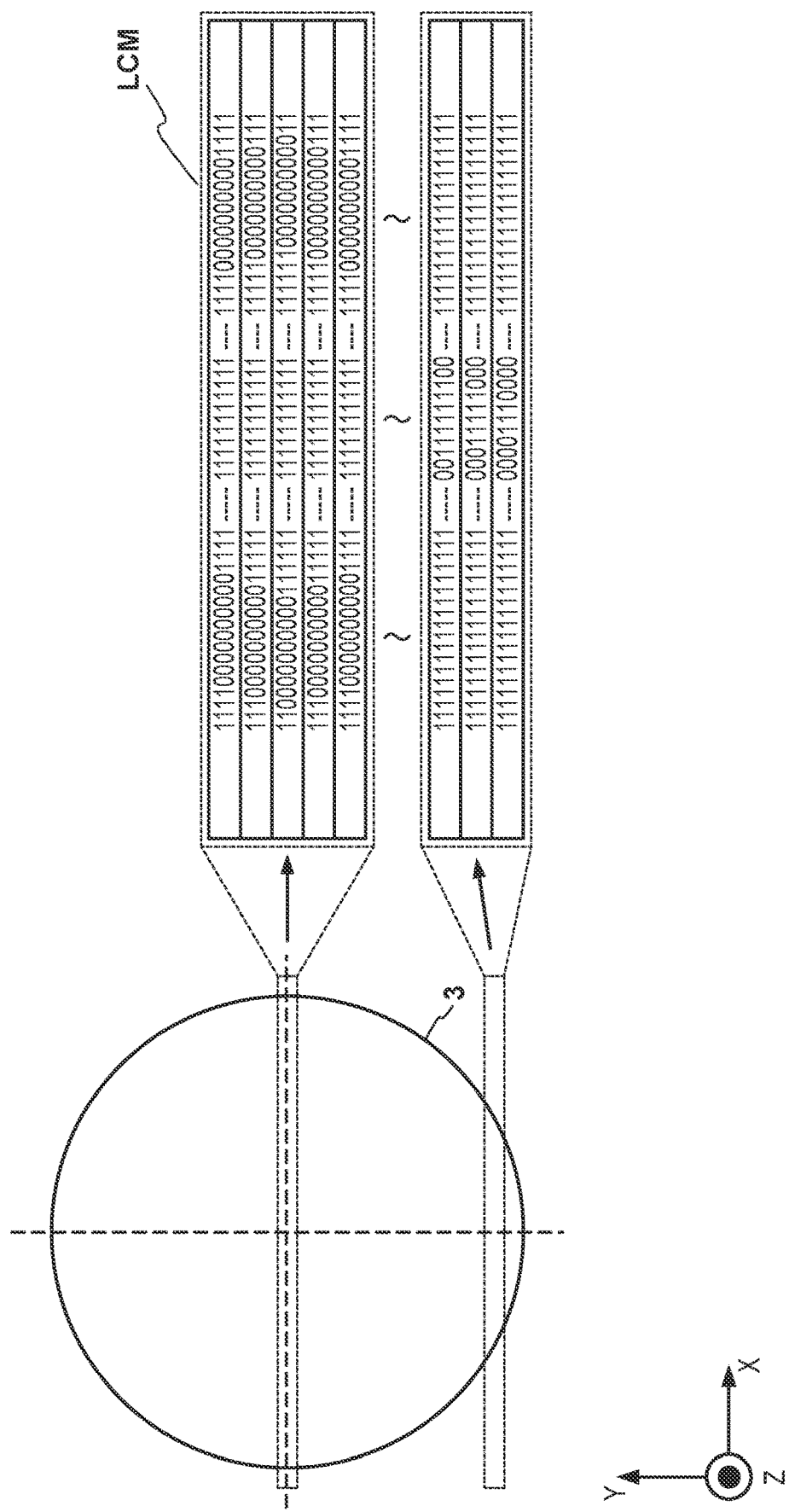
FIG. 8 is a view for explaining the first embodiment.
Figure 9:
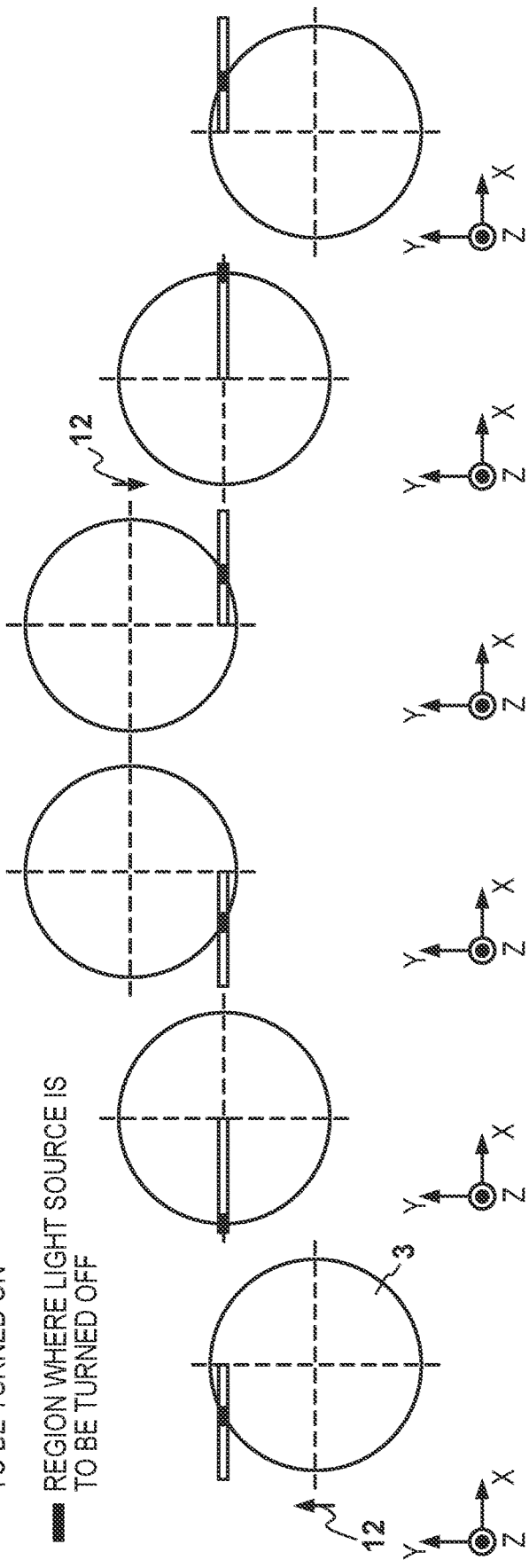
FIGS. 9A to 9F are views for explaining the first embodiment.

FIG. 8 shows a more specific example of the lighting control map described with reference to FIGS. 7A to 7D. A lighting control map LCM is obtained by converting an inspection target region (a region to be scanned with light by the scanning optical system SO and a stage 2) including the substrate 3 into a grid at a pitch which allows ON/OFF control of the light source 4 to be performed. The scanning line in the horizontal direction is the main scanning direction of light by a polygon mirror 5, and the ON/OFF control of the light source 4 is performed, for example, at a predetermined interval from left to right. "0" indicates that the light source 4 is to be turned off (OFF) and "1" indicates that the light source 4 is to be turned on (ON). The vertical direction is the sub-scanning direction of the stage scanning mechanism 19.

In a case in which, a fθ lens 6 cannot cover the diameter of the substrate 3 and the main scanning operation cannot be performed at once on the entire width of the substrate 3, the scanning region of the substrate 3 may be divided in the manner exemplified in FIGS. 9A to 9F. In this case, the scanning operation of the stage 2 can be divided into an operation to scan a forward scanning path and an operation to scan a backward scanning path. By restricting the variation of the ON/OFF duty during the scanning operation on the forward scanning path and the scanning operation on the backward scanning path, it becomes possible to suppress the wavelength of the light generated by the light source 4 to fall within the wavelength in which the chromatic aberration of the scanning optical system SO is corrected.

In the first embodiment, the lighting control map can be generated by correcting the lighting control map generated in step S405 in the processing shown in FIG. 4 of the comparative example. This correction is performed by setting "0"s to a section from the end of the scanning region to the edge of the substrate 3 and its nearby region to which "0"s (OFF) have been assigned. Alternatively, the lighting control map according to the first embodiment can be generated by assigning "0"s to the edge of the substrate 3 and its nearby region and assigning "1"s (ON) to other regions.

Second Embodiment

Figure 10:
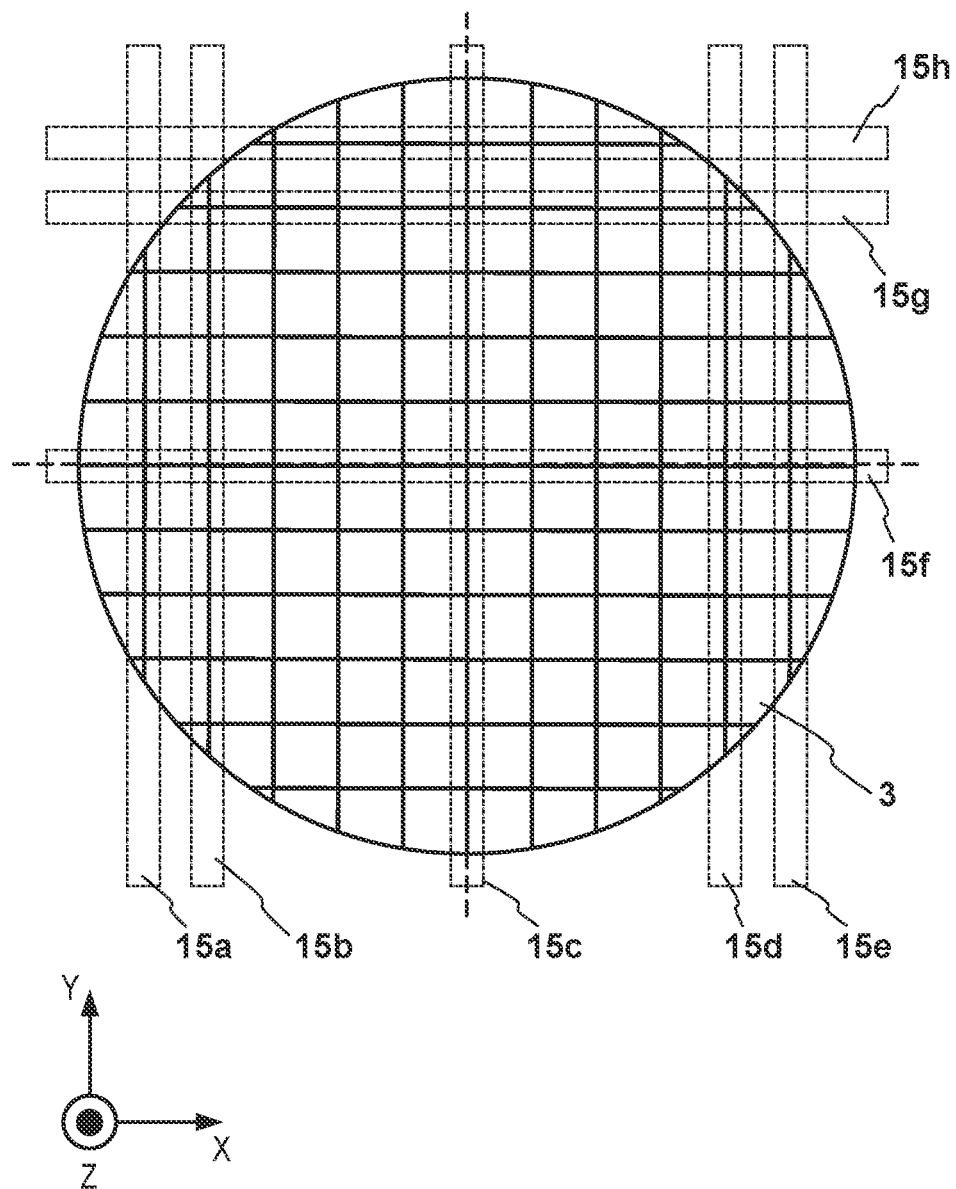
FIG. 10 is a view for explaining the second embodiment.

The second embodiment of the present invention will be described with reference to FIGS. 10, 11, and 12. Assume that matters not mentioned as the second embodiment follow those of the above-description. The pattern information (unevenness information) of a substrate 3 can be raised as an example of a factor that causes the ON/OFF duty to change for each scanning operation. FIG. 10 schematically shows a pattern provided on the substrate 3. From a macroscopic point of view, the substrate 3 can have lattice patterns 15a to 15h which can be represented by scribe lines or the like. When such patterns are irradiated with light, very intense scattered light can be generated from the patterns. Hence, a lighting control map LCM can be generated based on the pattern information of the substrate 3 or a reference map, which is obtained by processing described with reference to FIG. 3 as a comparative example, so as to prevent light irradiation on a pattern which is provided on the substrate 3 and can generate intense scattered light.

Figure 11:
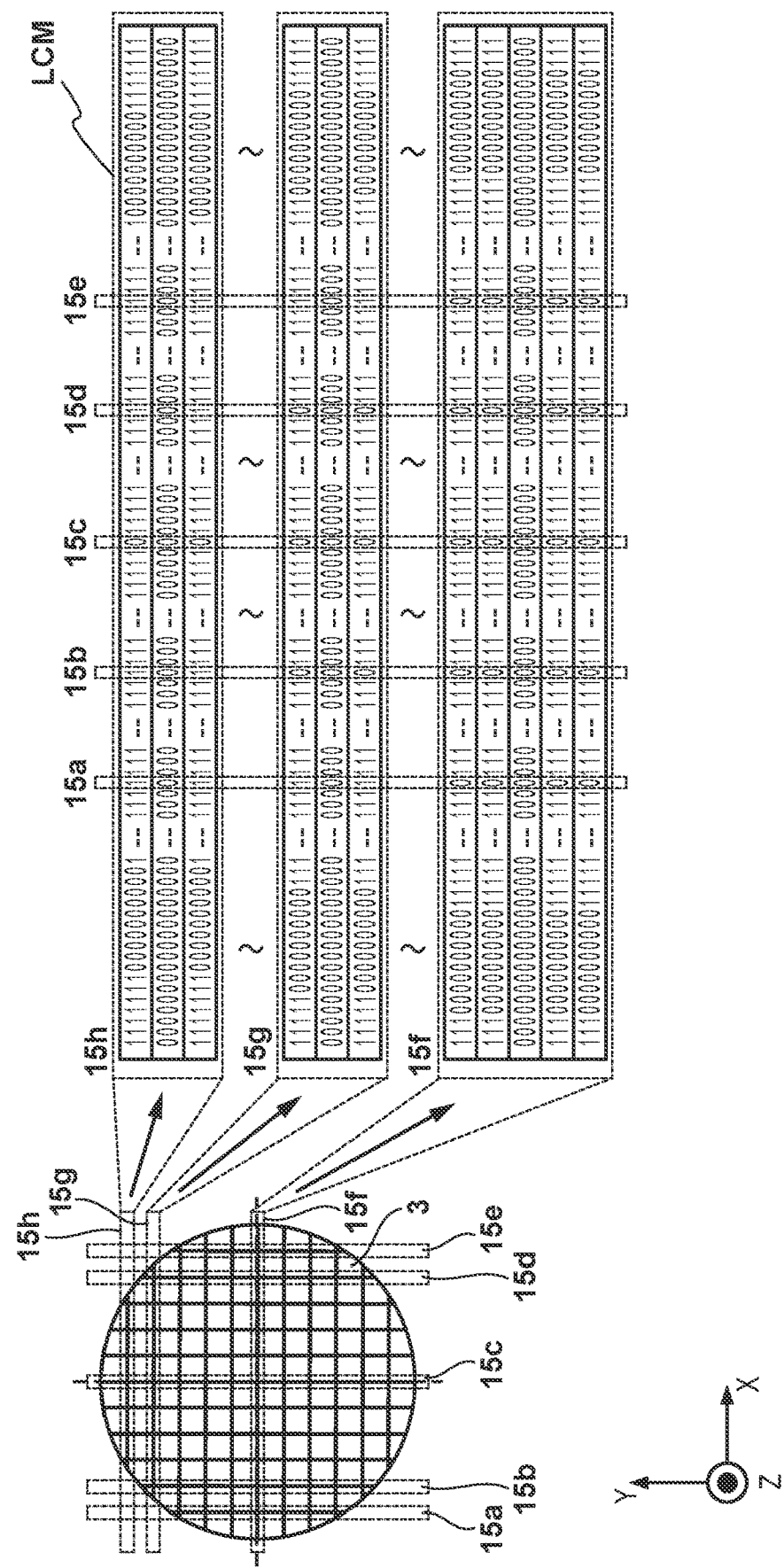
FIG. 11 is a view for explaining the second embodiment.

The lighting control map LCM according to the second embodiment is exemplified in FIG. 11. The rules related to the notation are similar to those of FIG. 10. The lattice pattern 15a to 15h on the substrate 3 can include scribe lines. Since the regions where the lattice patterns 15a to 15h are present will generate very intense scattered light, the lighting control map LCM can be generated to prevent light irradiation on these regions. The lighting control map LCM can be generated based on a reference map which is obtained by the processing described with reference to FIG. 3 as a comparative example. More specifically, the lighting control map can be generated by executing the processing of FIG. 4 after the reference map is generated by the processing of FIG. 3 and correcting the lighting control map generated in step S405. This correction can be performed to set a section from the end of a scanning region to the edge of the substrate 3 and its nearby region to which "0" (OFF) has been assigned as "0". Alternatively, the lighting control map LCM may be generated based on information (for example, design information) that can specify each region, such as a scribe line and/or a kerf portion or the like which will generate intense scattered light, on the substrate 3.

Although only the scribe lines are shown as the patterns that generate intense scattered light in FIGS. 10 and 11, each kerf portion and, furthermore, a circuit pattern can also generate intense scattered light in practice. If a region where a light source 4 is to be turned off is added in consideration of these portions and patterns, there will be an influence on the ON/OFF duty of each scanning period.

Figure 12:
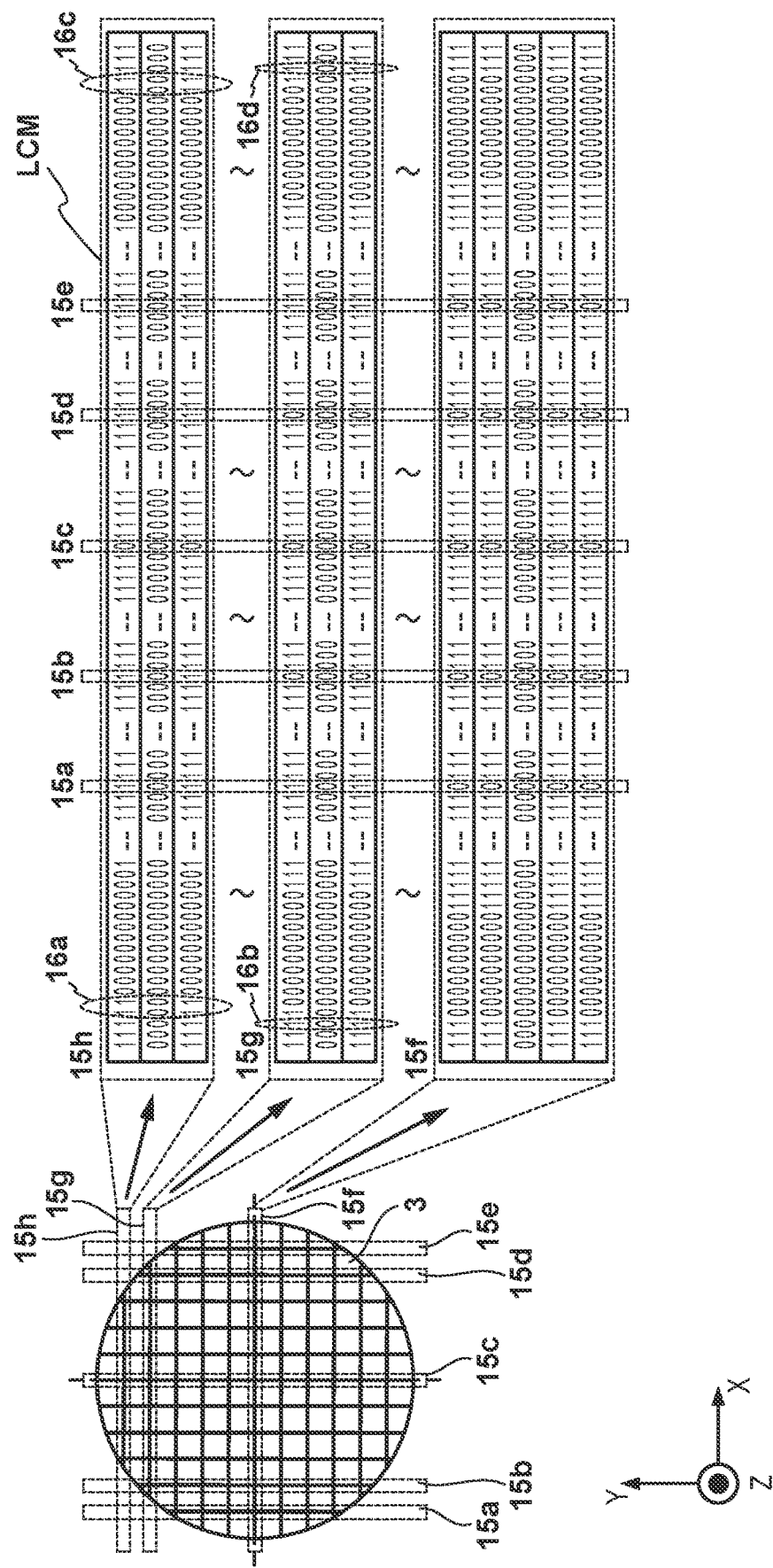
FIG. 12 is a view for explaining the second embodiment.

FIG. 12 shows an example of the lighting control map LCM obtained by correcting the lighting control map LCM of FIG. 11 so as to reduce the ON/OFF duty variation among the plurality of scanning periods. Since "0" (OFF) is assigned to the lighting control map LCM for the purpose of preventing the saturation and/or preventing lifetime degradation of a detector 8, the lighting control map LCM is corrected by adjusting the ON/OFF duty so that "0"s (OFF) will be increased. Thus, the lighting control map LCM can be corrected so that, among the plurality of scanning periods (plurality of scanning lines), the ON/OFF duties of the other scanning periods will become closer to the ON/OFF duty of the scanning period with the largest number of "0"s.

In the example, shown in FIG. 12, the scanning line that includes the pattern 15f has the largest number of "0"s because this scanning line overlaps the largest number of scribe lines. On the other hand, the scanning line including the pattern 15g and the scanning line including the pattern 15h have little overlap with the scribe line 15e. To reduce the variation in the ON/OFF duties of the plurality scanning periods (the plurality of scanning lines), parts of the sections of "1"s in the scanning line including the pattern 15g and in the scanning line including the pattern 15h need to be changed to sections of "0"s. Each section of "1"s is an effective region (a region to be used for manufacturing a device) of the substrate 3 and is required for foreign substance detection. Hence, the sections of "1"s positioned at a region outside of the substrate 3 are changed to the sections of "0"s as shown by corrected portions 16a to 16d.

Third Embodiment

The third embodiment provides a modification or an application example of the first and second embodiments. In the third embodiment, a light source 4 undergoes PWM control. More specifically, by performing PWM control for each grid on a lighting control map LCM by increasing the frequency of the frequency modulation for controlling ON/OFF of the light source 4, the output from the light source 4 will have gradation. For example, in a case in which frequency modulation at 100 MHz is executed at grid intervals, the output from the light source 4 can be variably controlled at 10 levels without lowering the scanning speed of the light if frequency modulation which is 10 times of the currently executed frequency modulation can be performed. Gradation control can be implemented by expressing the instruction value of each grid on the lighting control map LCM at 10 levels, and executing PWM control that changes the ON/OFF time ratio of the light source 4 at 10 levels in accordance with the instruction value for each grid. As a result, although the detection sensitivity with respect to region with a reduced light amount will decrease, it will be possible to perform measurement.

Fourth Embodiment

Figure 13:
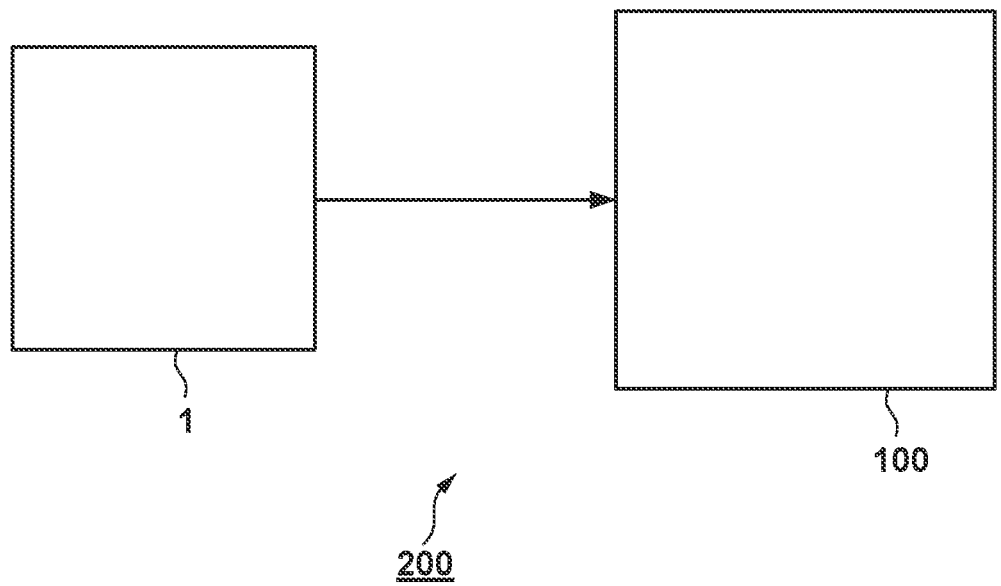
FIG. 13 is a view for explaining the fourth embodiment.

FIG. 13 shows a processing system 200 according to the fourth embodiment of the present invention. The processing system 200 can include a surface inspection apparatus 1 and a processing apparatus 100 that processes a substrate inspected by the surface inspection apparatus 1. The processing apparatus 100 can be, for example, an imprint apparatus that uses a mold to form, on a substrate, a pattern made of a cured product of a curable composition or a planarization apparatus that uses a mold to form, on a substrate, a planarized film made of a curable composition. Alternatively, the processing apparatus 100 can be an exposure apparatus that exposes a substrate coated with photosensitive material.

An application example of an imprint apparatus will be described. The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 14A:
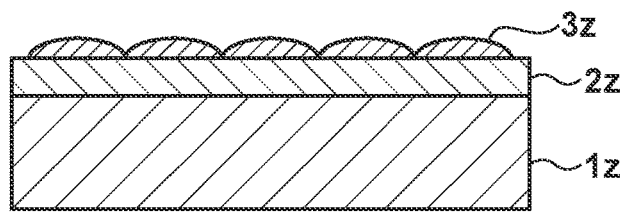
FIGS. 14A to 14F are views for explaining the fourth embodiment.

An article manufacturing method of forming a pattern on a substrate by an imprint apparatus, processing the substrate on which the pattern has been formed, and manufacturing an article from the processed substrate will be described next. As shown in FIG. 14A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 14B:
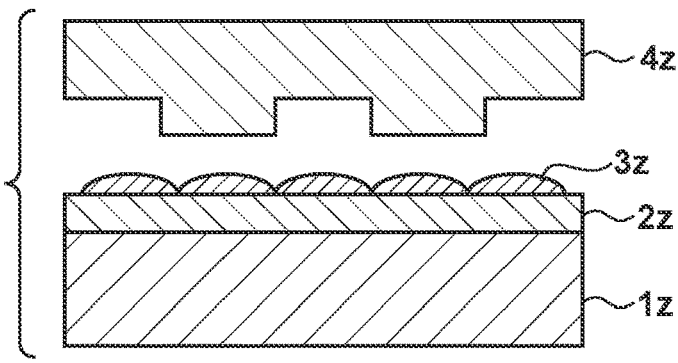
Figure 14C:
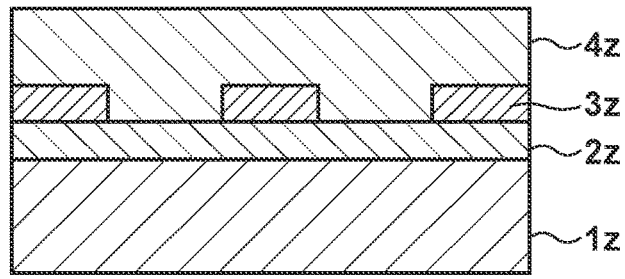

As shown in FIG. 14B, a side of a mold 4z for imprint with an uneven pattern is directed to and caused to face the imprint material 3z on the substrate. As shown in FIG. 14C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing via the mold 4z, the imprint material 3z is cured.

Figure 14D:
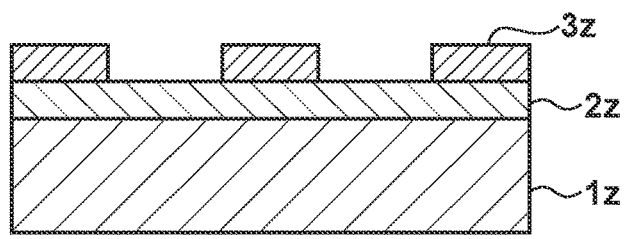

As shown in FIG. 14D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

Figure 14E:
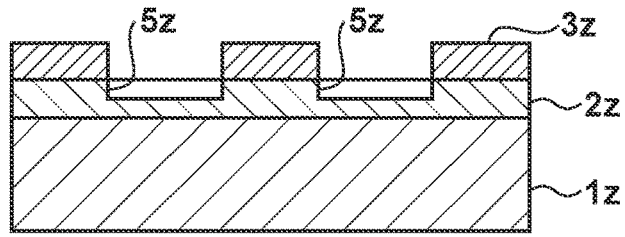
Figure 14F:
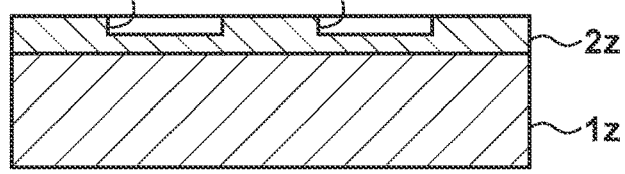

As shown in FIG. 14E, when etching is performed using the pattern of the cured product as an etching resistant mold, a portion of the surface of the processed material 2z where the cured product does not exist or remains thin is removed to form a groove 5z. As shown in FIG. 14F, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

Fifth Embodiment

The fifth embodiment provides a method of manufacturing an article. The method of manufacturing an article includes an inspection step of inspecting a foreign substance on a substrate by using a surface inspection apparatus 1 and a processing step of processing a substrate that has undergone the inspection step, and an article is manufactured from the substrate processed in the processing step. The inspection step and the processing step can be executed by using, for example, a processing system 200 according to the fourth embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-167488, filed Sep. 13, 2019, which is hereby incorporated by reference herein in its entirety.

What is claimed is:

1. A surface inspection apparatus that includes a stage configured to hold a substrate, a light source, a scanning optical system configured to scan light from the light source along a first direction for a plurality of times, a stage scanning mechanism configured to scan the stage in a second direction which intersects with the first direction, and a detector configured to detect scattered light from a surface of the substrate, and inspects the surface of the substrate based on a signal from the detector, wherein
an inspection target region of the substrate is scanned by the light from the light source by an operation of the scanning optical system and the stage scanning mechanism,
chromatic aberration of the scanning optical system is corrected to fall within a predetermined wavelength range,
a fluctuation range of a wavelength of the light generated by the light source is determined based on variation in a total lighting time of the light source in a scanning period of each light scanning operation performed a plurality of times along the first direction by the scanning optical system, and
the fluctuation range falls within the predetermined wavelength range.

2. The apparatus according to claim 1, wherein lighting of the light source is controlled so an edge of the substrate is not irradiated with the light.

3. The apparatus according to claim 1, wherein lighting of the light source is controlled in accordance with unevenness information of the surface of the substrate.

4. The apparatus according to claim 1, wherein lighting of the light source is performed by PWM control.

5. The apparatus according to claim 1, wherein lighting of the light source is controlled so that a region outside of the substrate will also be irradiated with the light in addition to the inspection target region of the substrate.

6. The apparatus according to claim 5, wherein the light scanning operations performed for the plurality of times includes an operation to scan a first scanning line between an edge of the substrate and a center of the substrate in the second direction and an operation to scan a second scanning line between the first scanning line and the center, and
a total time in which the region outside of the substrate is irradiated with the light in the operation to scan the first scanning line is longer than a total time in which the region outside of the substrate is irradiated with the light in the operation to scan the second scanning line.

7. The apparatus according to claim 1, wherein an operation to detect a region that can be irradiated with light on the substrate is executed, and lighting of the light source is controlled based on a region detected by the operation.

8. The apparatus according to claim 1, wherein in the scanning period of each light scanning operation performed for a plurality of times, the total lighting time of the light source falls within a range not more than ±20% of a reference time.

9. The apparatus according to claim 1, wherein in the scanning period of each light scanning operation performed for a plurality of times, the total lighting time of the light source falls within a range not more than ±10% of a reference time.

10. The apparatus according to claim 1, wherein in the scanning period of each light scanning operation performed for a plurality of times, the total lighting time of the light source falls within a range not more than ±6% of a reference time.

11. A processing system comprising:
the surface inspection apparatus defined in claim 1; and
a processing apparatus configured to process the substrate inspected by the surface inspection apparatus.

12. A method of manufacturing an article, the method comprising:
inspecting a foreign substance on the substrate by the surface inspection apparatus defined in claim 1; and
processing the substrate which has undergone the inspecting,
wherein the article is manufactured from the substrate processed in the processing.

13. The apparatus according to claim 1, further comprising a controller configured to control lighting of the light source based on a corrected lighting control map obtained by correcting a lighting control map generated by an operation to detect a region that can be irradiated with the light on the substrate such that the variations in the total lighting times of the light source in the respective scanning periods are reduced.

14. A surface inspection apparatus that includes a stage configured to hold a substrate, a light source, a scanning optical system configured to scan light from the light source along a first direction a plurality of times, a stage scanning mechanism configured to scan the stage in a second direction which intersects with the first direction, and a detector configured to detect scattered light from a surface of the substrate, and inspects the surface of the substrate based on a signal from the detector, wherein an inspection target region of the substrate is scanned by the light from the light source by an operation of the scanning optical system and the stage scanning mechanism, and lighting of the light source is controlled so that a region outside of the substrate will also be irradiated with the light in addition to the inspection target region of the substrate, and an edge of the substrate will not be irradiated with the light.

15. The apparatus according to claim 14, wherein the scanning of light along the first direction performed for the plurality of times by the scanning optical system includes an operation to scan a first scanning line between an edge of the substrate and a center of the substrate in the second direction and an operation to scan a second scanning line between the first scanning line and the center, and a total time in which the region outside of the substrate is irradiated with the light in the operation to scan the first scanning line is longer than a total time in which the region outside of the substrate is irradiated with the light in the operation to scan the second scanning line.

16. A processing system comprising:

the surface inspection apparatus defined in claim 14; and a processing apparatus configured to process the substrate inspected by the surface inspection apparatus.

17. A method of manufacturing an article, the method comprising:

inspecting a foreign substance on the substrate by the surface inspection apparatus defined in claim 14; and processing the substrate which has undergone the inspecting, wherein the article is manufactured from the substrate processed in the processing.

18. The apparatus according to claim 14, wherein a scanning region including the inspection target region of the substrate is scanned by the light from the light source by the operation of the scanning optical system and the stage scanning mechanism, the scanning region having a first end and a second end, the scanning region includes a first region from the first end to a position near a first-end-side edge of the substrate, the inspection target region, and a second region from an edge of the substrate, which is opposite to the first-end-side edge, to the second end, wherein the first region and the second region are the regions outside of the substrate, the lighting of the light source is controlled so that the first region and the second region will be irradiated with the light.

* * * * *